(12) United States Patent
Nayak et al.

(10) Patent No.: US 6,194,259 B1
(45) Date of Patent: Feb. 27, 2001

(54) FORMING RETROGRADE CHANNEL PROFILE AND SHALLOW LLDD/S-D EXTENSIONS USING NITROGEN IMPLANTS

(75) Inventors: Deepak K. Nayak, Santa Clara; Ming-Yin Hao, Sunnyvale, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 08/884,126

(22) Filed: Jun. 27, 1997

(51) Int. Cl.$^7$ .............................................. H01L 21/8238
(52) U.S. Cl. ......................... 438/220; 438/528; 438/566
(58) Field of Search ........................... 438/200, 526–528, 438/566

(56) References Cited

U.S. PATENT DOCUMENTS

| | | | |
|---|---|---|---|
| 4,683,637 | * 8/1987 | Varker et al. | 438/296 |
| 4,835,112 | * 5/1989 | Pfiester et al. | 438/528 |
| 5,387,552 | * 2/1995 | Iranmanesh | 438/203 |
| 5,500,391 | * 3/1996 | Bevk et al. | 438/442 |
| 5,633,177 | * 5/1997 | Anjum | 438/301 |
| 5,744,371 | * 4/1998 | Kadosh et al. | 438/528 |
| 5,851,922 | * 12/1998 | Bevk | 438/655 |
| 5,886,458 | * 2/1999 | Lee | 438/277 |

OTHER PUBLICATIONS

S. Wolf Silicon Processing for the VLSI Era vol. 2 Lattice Press pp. 381–382, 1990.*
S Wolf Silicon Processing for the VSLI Era vol. 3 Lattice Press pp. 307–313, 1995.*

"The effect of nitrogen in p+ polysilicon gates on boron penetration into silicon substrate through the gate oxide" by Satoshi Nakayama and Tetsushi Sakai, 1996 Symposium on VLSI Technology Digest of Tech. Papers.

* cited by examiner

Primary Examiner—Charles Bowers
Assistant Examiner—David S Blum
(74) Attorney, Agent, or Firm—H. Donald Nelson

(57) ABSTRACT

A method of forming a retrograde channel concentration profile in the NMOS region of a semiconductor device and forming a shallow LDD regions in a PMOS region of the semiconductor device. The retrograde channel concentration profile in the NMOS regions is formed by implanting nitrogen and boron ions into the NMOS region at selected concentrations and implantation energy levels. The nitrogen ions are implanted in the NMOS region at a selected concentration in the range of $1 \times 10^{13}$ to $2 \times 10^{15}$ ions per cm$^2$ and at a selected implantation energy in the range of 10–100 KeV. The boron ions are implanted in the NMOS region at a selected concentration in the range of $1 \times 10^{12}$ to $1 \times 10^{14}$ ions per cm$^2$ and at a selected implantation energy in the range of 5–50 KeV. The shallow LDD regions in the PMOS region are formed by implanting nitrogen and boron ions into the PMOS region at selected concentrations and implantation energy levels. The nitrogen ions are implanted in the PMOS region at a selected concentration in the range of $1 \times 10^{13}$ to $2 \times 10^{15}$ ions per cm$^2$ and at a selected implantation energy in the range of 5–50 Kev. The boron ions are implanted in the PMOS region in a selected concentration in the range of $1 \times 10^{14}$ to $5 \times 10^{15}$ ions per cm$^2$ and at a selected implantation energy in the range of 10–20 KeV.

23 Claims, 4 Drawing Sheets

FORMING RETROGRADE CHANNEL PROFILE AND SHALLOW LLDD/S-D EXTENSIONS USING NITROGEN IMPLANTS

BACKGROUND OF THE INVENTION

1. Field of the Invention

This invention relates generally to the manufacture of high performance semiconductor devices. The invention relates more specifically to the manufacture of submicron, high-performance semiconductor devices using nitrogen implants to obtain a retrograde channel profile in an NMOS device and to obtain shallow LDD regions in a PMOS device.

2. Discussion of the Related Art

The semiconductor industry is increasingly characterized by a growing trend toward fabricating larger and more complex circuits on a given semiconductor chip. This is being achieved by reducing the size of individual devices within the circuits and spacing the devices closer together. The reduction of the size of individual devices and the closer spacing brings about improved electrical performance.

There is increasing interest in MOS integrated circuits in which the component devices have gate dimensions as small as 0.35 μpm or less. Devices having such small dimensions suffer from certain problems that are not of serious concern when the gate dimensions are greater than about 1 μm.

The threshold voltage, $V_T$, is one of the most important parameters of a MOSFET and is defined as the gate voltage at the onset of strong inversion. In many MOS integrated circuit applications it is critical to be able to establish and maintain a uniform and stable threshold voltage, $V_T$. There are several factors that affect the value of the threshold voltage, however, the most feasible factor to manipulate in order to adjust the threshold voltage was the amount of substrate doping, $N_A$, in n-channel devices, and $N_D$ in p-channel devices. However, merely increasing the substrate doping causes adverse effects in other MOSFET characteristics, such as lower junction-breakdown voltages, larger junction capacitances, and lower carrier mobilities. The latter two adversely affect the speed of the device. As can be appreciated, the adjustment of threshold voltages was a delicate balancing act between obtaining a usable and stable threshold voltage and the adverse effects caused by the increase in substrate doping. The development of ion implantation for adjustment of threshold voltage provided a method for the reliable production of MOS integrated circuits. The ion implantation made it possible to select the substrate-doping value without having to consider its impact on threshold voltage value because ion implantation can be used either to increase or decrease, by compensation, the net dopant concentration at the silicon surface. Because of this, substrate doping can theoretically be selected strictly on the basis of optimum device performance since threshold voltage can be adjusted by an implant process. The threshold voltage adjust implant technique involves implantation of boron, phosphorus, or arsenic ions into the surface of the substrate of a MOSFET. The threshold voltage adjust implant is done at an energy selected to place the peak of the implant slightly below the silicon substrate surface. By implanting ions near the Si surface, a nonuniformly doped channel is produced. Besides shifting the threshold voltage the ion implant alters the MOSFET behavior in several ways compared to devices having uniformly doped channels. The threshold voltage adjust implant introduces extra ions into the channel depletion region, causing its width to be modified. In addition, the non-uniform doping profile changes the long-channel subthreshold characteristic such as the slope of the log $I_D$ vs. $V_{GS}$ curves, and the punchthrough behavior of short-channel devices.

However, as the device dimensions have continued to decrease below 0.35 μm, short-channel effects become very important. In order to improve short-channel effects, channel engineering as well as shallow LDD junctions are required. For example, it is known that a retrograde channel profile improves short-channel behavior. As known in the art, a retrograde channel profile is one in which the peak concentration is below the surface. It has been found that boron implants, because of the high diffusivity of boron ions, have not been satisfactory. Although the boron ions can be implanted with an initial precise and predictable concentration profile, subsequent high temperature processes cause the boron ions to diffuse to a great extent into the substrate resulting in a substantially uniform concentration profile in the substrate. Because the desired concentration profile in an NMOS device is a retrograde concentration profile, the continued use of boron has been problematic. One attempt to alleviate this problem has been to use indium rather than boron as a doping agent. In a PMOS device, it is desired that the LDD (lightly doped drain) regions be very shallow to avoid punchthrough and other problems. Therefore, the boron implant must be very shallow and the shallowness of the boron implant must be maintained throughout the subsequent processes. However, as in the case of the retrograde concentration channel profile, the high diffusivity of boron prevents the maintenance of the shallow boron implant.

Therefore, what is needed is a method to control the profile of the boron implant to achieve and maintain a retrograde channel concentration profile in an NMOS device and a method to control the profile of the boron implant in a PMOS device to obtain and maintain shallow LDD regions.

SUMMARY OF THE INVENTION

The present invention is directed to a method of forming a retrograde channel concentration profile in the NMOS region of a semiconductor device. The retrograde channel concentration profile is formed by implanting nitrogen ions into the NMOS region at a selected concentration and energy and by implanting boron ions into the NMOS region at a selected concentration and energy. The nitrogen ions are implanted at a selected concentration in the range of $1 \times 10^{13}$ to $2 \times 10^{15}$ ions per cm$^2$ and at a selected implantation energy in the range of 10–100 KeV. The boron ions are implanted at a selected concentration in the range of $1 \times 10^{12}$ to $1 \times 10^{14}$ ions per cm$^2$ and at a selected implantation energy in the range of 5–50 KeV.

The present invention is further directed to a method of forming shallow LDD regions in a PMOS region of a semiconductor device. The shallow LDD regions are formed by implanting nitrogen ions into the source and drain regions at a selected concentration and energy implant level and by implanting boron ions into the source and drain regions at a selected concentration. The nitrogen ions are implanted into the source and drain regions at a selected concentration in the range of $1 \times 10^{13}$ to $2 \times 10^{15}$ ions per cm$^2$ and at a selected implantation energy in the range of 5–50 KeV. The boron ions are implanted into the source and drain regions at a selected concentration in the range of $1 \times 10^{14}$ to $5 \times 10^{15}$ ions per cm$^2$ and at a selected implantation energy in the range of 10–20 KeV.

The present invention is still further directed to a method of forming a retrograde channel concentration profile in the NMOS region of a cmos semiconductor device and to a method of forming shallow LDD regions in the PMOS region of the cmos semiconductor device. The retrograde channel concentration profile is formed by masking the PMOS region and implanting nitrogen and boron ions into the NMOS region at selected concentrations and energy levels. The nitrogen ions are implanted into the NMOS region at a selected concentration in the range of $1\times10^{13}$ to $2\times10^{15}$ ions per cm² an at a selected implantation energy in the range of 10–100 KeV. The boron ions are implanted into the NMOS region at a selected concentration in the range of $1\times10^{12}$ to $1\times10^{14}$ ions per cm² and at a selected implantation energy in the range of 5–50 KeV. The mask is removed from the PMOS region, the NMOS region is masked and the shallow p-n junction is formed by implanting nitrogen and boron ions into the PMOS region at selected concentrations and energy levels. The nitrogen ions are implanted into the PMOS region at a selected concentration in the range of $1\times10^{13}$ to $2\times10^{15}$ ions per cm² and at a selected implantation energy in the range of 5–50 KeV. The boron ions are implanted into the PMOS region at a selected concentration in the range of $1\times10^{14}$ to $5\times10^{15}$ ions per cm² and at a selected implantation energy in the range of 10–20 KeV.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modification in various obvious aspects, all without departing from the scope of the invention. Accordingly, the drawings and detailed description are to be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Reference is now made in detail to specific embodiments of the present invention that illustrate the best mode presently contemplated by the inventors for practicing the invention.

Figure 1:
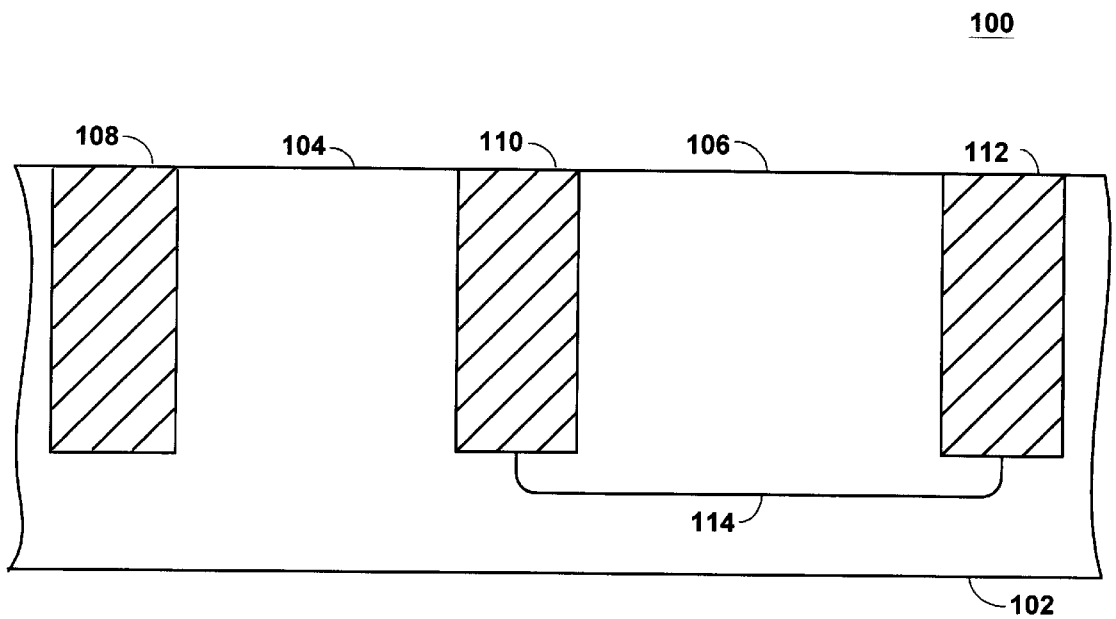
FIG. 1 shows a portion of a semiconductor device with trench or field oxide regions defining an NMOS region and a PMOS region in an n-well region.

The figures illustrate selected steps in the process of manufacturing a semiconductor device 100 that best describe the present invention. FIG. 1 shows a portion of the semiconductor device 100 that is manufactured on a silicon p-doped substrate 102. The portion of the semiconductor device 100 is divided into the NMOS region 104 and the PMOS region 106 by isolation structures such as trench or field oxide regions 108, 110, and 112. The PMOS region 106 is formed in an n-well region 114 formed in the p-doped substrate 102.

Figure 2:
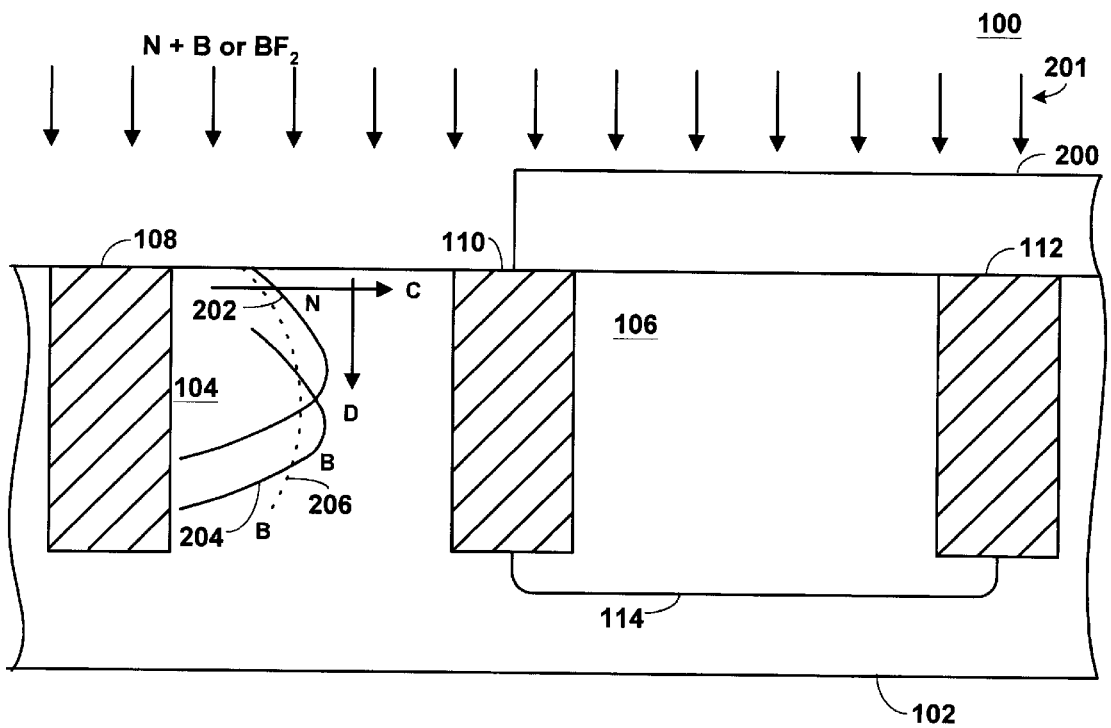
FIG. 2 shows the portion of the semiconductor device shown in FIG. 1 with the PMOS region masked and N and B or $BF_2$ ions being implanted into the NMOS region.

FIG. 2 shows the semiconductor device 100 shown in FIG. 1 with a mask 200 formed over the PMOS region 106 and nitrogen ions (N) and boron ions (B) or boron fluoride ions (BF2) are indicated by arrows 201 being implanted into the semiconductor device 100. The nitrogen ions are implanted with a selected concentration in the range of $1\times10^{13}$ to $2\times10^{15}$ ions per cm² and at a selected implantation energy in the range of 10–100 KeV. The boron ions are implanted with a selected concentration in the range of $1\times10^{12}$ to $1\times10^{14}$ ions per cm² and at a selected implantation energy in the range of 5–50 KeV. Shown in the NMOS region 104 are concentration profiles with the concentration on the axis labeled C and the depth into the semiconductor device 100 on the axis labeled D. The profile 202 shows the concentration profile of the nitrogen ions after being implanted into the semiconductor device 100. The profile 204 shows the concentration profile of the boron ions immediately after being implanted into the semiconductor device 100. The profile 206 shows the concentration profile of the boron ions after the semiconductor device 100 has been subjected to one or more high temperature processes. The retrograde concentration profile of the boron implant shown by 206 is maintained because the nitrogen ions inhibit the diffusion of the boron ions during subsequent high temperature manufacturing processes. The nitrogen implant profile is closer to the surface than the boron implant profile.

Figure 3:
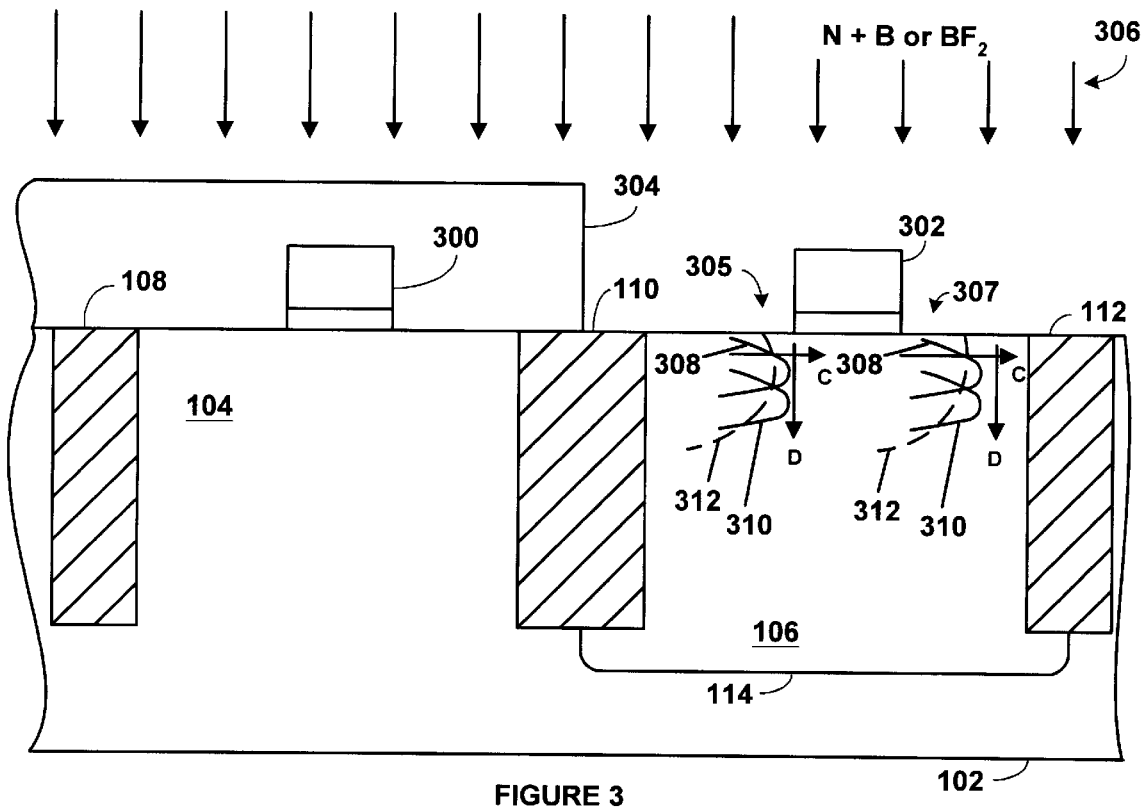
FIG. 3 shows the portion of the semiconductor device shown in FIG. 2 with the NMOS region masked, a gate formed on the PMOS region and N and B or $BF_2$ ions being implanted into the source and drain regions in the PMOS region.

FIG. 3 shows the semiconductor device 100 shown in FIG. 2 with a gate 300 formed on the NMOS region 104, and a gate 302 formed on the PMOS region 106. A mask layer 304 is formed on the NMOS region 104 and nitrogen ions (N) and boron ions (B) or boron fluoride ions ($BF_2$), indicated by arrows 306, are shown being implanted into the semiconductor device 100. The nitrogen ions are preferably implanted before the boron ions, however, the nitrogen ions can be implanted after the boron ions. The nitrogen ions are implanted with a selected concentration in the range of $1\times10^{13}$ to $2\times10^{15}$ ions per cm² and at a selected implantation energy in the range of 5–50 KeV. The boron ions are implanted with a selected concentration in the range of $1\times10^{14}$ to $5\times10^{15}$ ions per cm² and at a selected energy in the range of 10–20 KeV. Shown in the PMOS region 106 are concentration profiles in regions that will form a source region 305 and a drain region 307. Shown in the source region 305 and drain region 307 are concentration profiles that are substantially identical. The concentration profiles have the concentration on the axis labeled C and the depth into the semiconductor device 100 on the axis labeled D. Because the profiles are substantially the same like numerals are used on both the source and drain concentration profiles. The profile 308 shows the concentration profile of the boron ions immediately after being implanted. The profile 310 shows the concentration profile of the nitrogen ions immediately after being implanted. The profile 312 shows the concentration profile of the boron ions after the semiconductor device 100 has been subjected to one or more high temperature processes. The boron profile 312 has been shaped because the nitrogen ions slow the diffusion of the boron ions.

Figure 4:
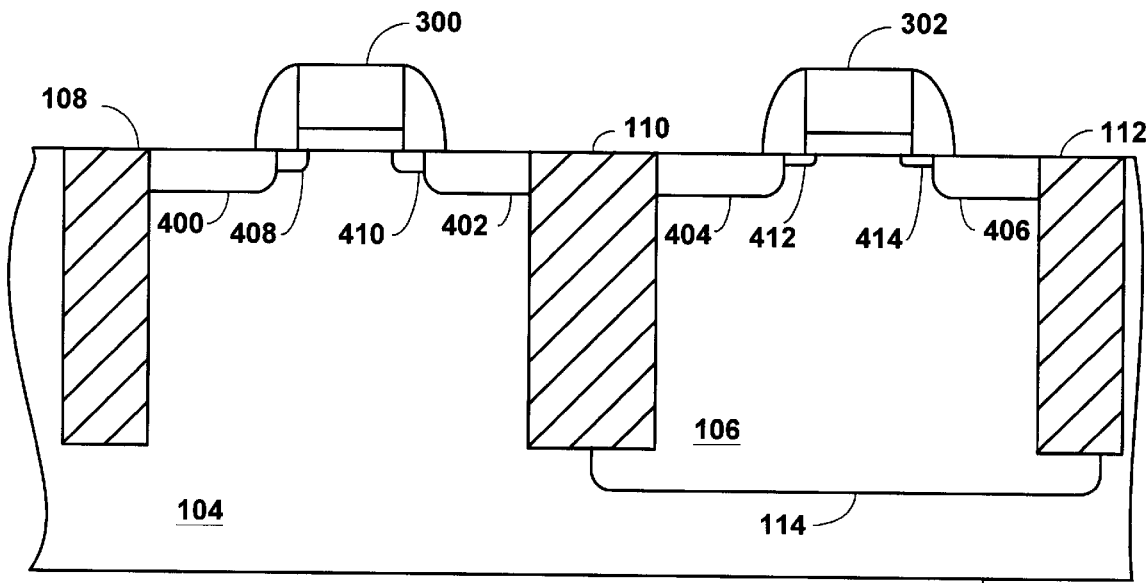
FIG. 4 shows the portion of the semiconductor device shown in FIG. 3 with spacers formed on the gates on the NMOS and PMOS regions and source and drain regions formed in the NMOS and PMOS regions.

FIG. 4 show the semiconductor device 100 with the mask layer 304 removed, source region 400 and the drain region 402 formed in the NMOS region 104, and the source region 404 and the drain region 406 formed in the PMOS region 106. LDD regions 408 and 410 are shown formed on source region 400 and drain region 402, respectively. LDD regions 412 and 414 are shown formed on source region 412 and drain region 406, respectively.

Figure 5:
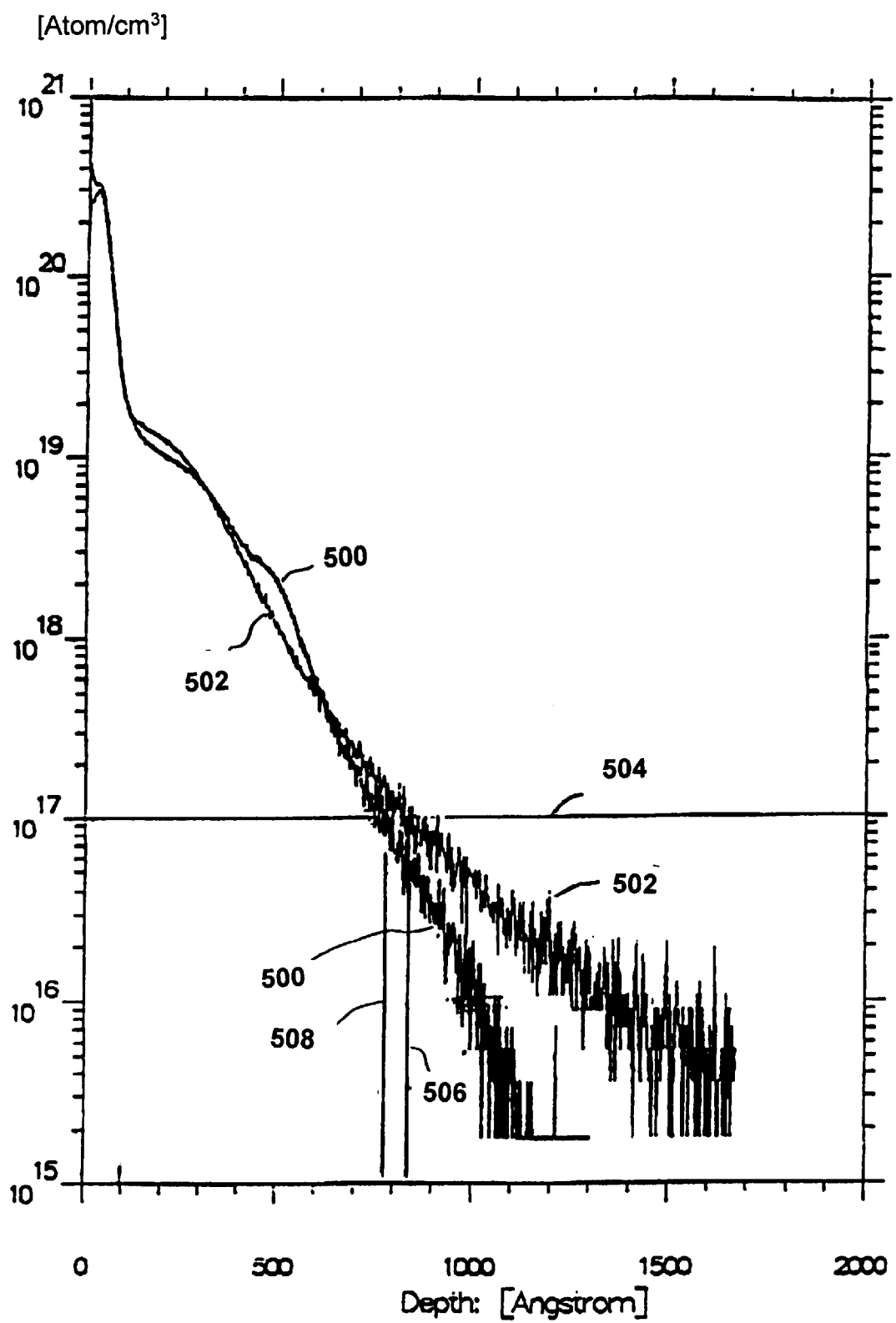
FIG. 5 compares a measured concentration profile of boron with a nitrogen implant in accordance with the present invention with a measured concentration profile of boron without a nitrogen implant.

FIG. 5 compares a measured concentration profile of boron with a nitrogen implant 500 with a measured concentration profile of boron without a nitrogen implant 502. The line 504 represents the dopant concentration of the substrate that determines the p-n junction. The line 506 shows the depth of the p-n junction formed by the boron implant without a nitrogen implant and the line 508 shows the depth of the p-n junction formed by the boron implant with a nitrogen implant. The shallower p-n junction formed by the boron with the nitrogen implant is clearly shown.

Figure 6:
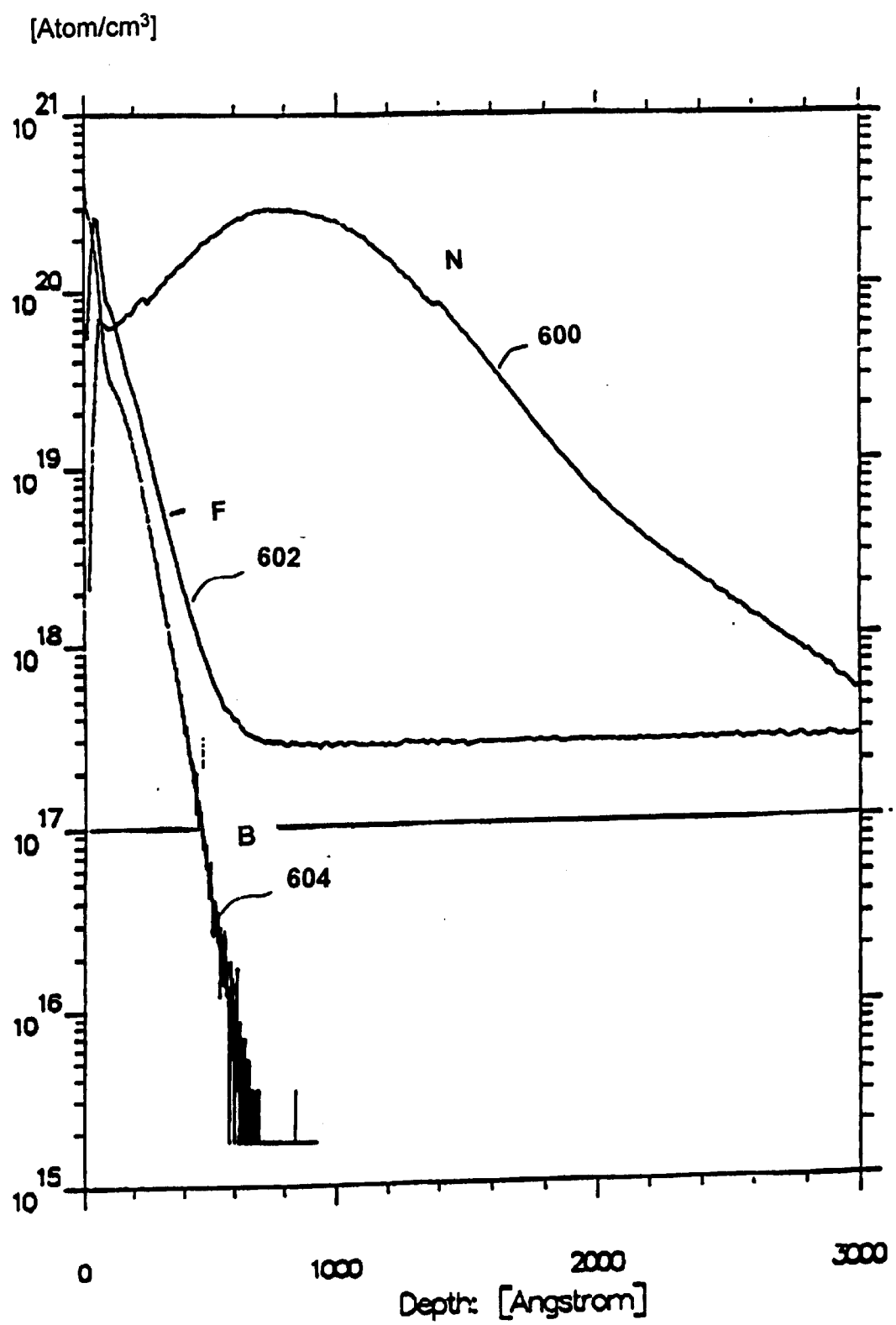
FIG. 6 shows concentration profiles of nitrogen atoms, fluorine atoms, and boron atoms in a silicon substrate.

FIG. 6 shows concentration profiles of nitrogen ions 600, fluorine ions 602, and boron ions 604. The concentration profiles are measured values and shows that the nitrogen concentration profile 600 peaks at approximately 900 angstroms. The boron ions peak at a very shallow depth and decreases rapidly. This shows clearly that the implanted nitrogen ions prevent the boron ions from diffusing to any substantial depth in the substrate.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of forming a retrograde concentration profile in a source and drain region of an NMOS region of a semiconductor device, the method comprising:

implanting nitrogen ions directly into regions of a substrate in which sources and drains are to be formed; and implanting boron ions into the regions of the substrate in which the sources and drains are to be formed.

2. The method of claim 1, wherein the nitrogen ions are implanted in a selected concentration in the range of $1 \times 10^{13}$ to $2 \times 10^{15}$ ions per $cm^2$.

3. The method of claim 2, wherein the nitrogen ions are implanted with a selected implantation energy in the range of 10–100 KeV.

4. The method of claim 1, wherein the boron ions are implanted in a selected concentration in the range of $1 \times 10^{12}$ to $1 \times 10^{14}$ ions per $cm^2$.

5. The method of claim 4, wherein the boron ions are implanted with a selected implantation energy in the range of 5–50 KeV.

6. A method of forming shallow LDD regions in a PMOS region of a semiconductor device, the method comprising:

implanting nitrogen ions directly into regions of a substrate in which the shallow LDD regions are to be formed; and implanting boron ions into the regions of the substrate in which the shallow LDD regions are to be formed.

7. The method of claim 6, wherein the nitrogen ions are implanted in a selected concentration in the range of $1 \times 10^{13}$ to $2 \times 10^{15}$ ions per $cm^2$.

8. The method of claim 6, wherein the nitrogen ions are implanted with a selected implantation energy in the range of 5–50 KeV.

9. The method of claim 7, wherein the nitrogen ions are implanted with a selected implantation energy in the range of 5–50 KeV.

10. The method of claim 6, wherein the boron ions are implanted in a selected concentration in the range of $1 \times 10^{14}$ to $5 \times 10^{15}$ ions per $cm^2$.

11. The method of claim 10, wherein the boron ions are implanted with a selected implantation energy in the range of 10–20 KeV.

12. The method of claim 9, wherein the boron ions are implanted in a selected concentration in the range of $1 \times 10^{14}$ to $5 \times 10^{15}$ ions per $cm^2$.

13. The method of claim 12, wherein the boron ions are implanted with a selected implantation energy in the range of 10–20 KeV.

14. A method of forming a retrograde concentration profile in a source and drain region of an NMOS region of a CMOS semiconductor device and of forming shallow LDD regions in a PMOS region of the CMOS device, the method comprising;

forming at least one NMOS region and at least one PMOS region in a silicon substrate with isolation structures separating the at least one NMOS region from the at least one PMOS region;

forming a mask on the PMOS region;

implanting nitrogen ions directly into the substrate in regions in which the source and drain regions are going to be formed in the NMOS region; and implanting boron ions directly into the substrate in regions in which the source and drain regions are going to be formed.

15. The method of claim 6 further comprising:

removing the mask from the PMOS region;

forming a mask on the NMOS region;

implanting nitrogen ions directly into the substrate in regions in which the LDD regions are to be formed; and implanting boron ions into the PMOS region.

16. The method of claim 15, wherein the nitrogen ions are implanted into the NMOS region in a selected concentration in the range of $1 \times 10^{13}$ to $2 \times 10^{15}$ ions per $cm^2$.

17. The method of claim 16, wherein the nitrogen ions are implanted into the NMOS region with a selected implantation energy in the range of 10–100 KeV.

18. The method of claim 17, wherein the boron ions are implanted into the NMOS region in a selected concentration in the range of $1 \times 10^{12}$ to $1 \times 10^{14}$ ions per $cm^2$.

19. The method of claim 18, wherein the boron ions are implanted into the NMOS region with a selected implantation energy in the range of 5–50 KeV.

20. The method of claim 19, wherein the nitrogen ions are implanted into the PMOS region in a selected concentration in the range of $1 \times 10^{13}$ to $2 \times 10^{15}$ ions per $cm^2$.

21. The method of claim 20, wherein the nitrogen ions are implanted into the PMOS region with a selected implantation energy in the range of 5–50 KeV.

22. The method of claim 21, wherein the boron ions are implanted into the PMOS region in a selected concentration in the range of $1 \times 10^{14}$ to $5 \times 10^{15}$ ions per $cm^2$.

23. The method of claim 22, wherein the boron ions are implanted into the PMOS region with a selected implantation energy in the range of 10–20 KeV.

* * * * *